United States Patent
Popovic et al.

(10) Patent No.: US 8,624,587 B2
(45) Date of Patent: Jan. 7, 2014

(54) MAGNETIC FIELD SENSOR MEASURING A DIRECTION OF A MAGNETIC FIELD IN A PLANE AND CURRENT SENSOR

(75) Inventors: Radivoje Popovic, Zug (CH); Mirjana Banjevic, Lausanne (CH)

(73) Assignee: Senis AG, Zug (CH)

(*) Notice: Subject to any disclaimer, the term of this patent is extended or adjusted under 35 U.S.C. 154(b) by 577 days.

(21) Appl. No.: 12/936,906

(22) PCT Filed: Apr. 8, 2009

(86) PCT No.: PCT/EP2009/054225
§ 371 (c)(1),
(2), (4) Date: Dec. 20, 2010

(87) PCT Pub. No.: WO2009/124969
PCT Pub. Date: Oct. 15, 2009

(65) Prior Publication Data
US 2011/0101975 A1    May 5, 2011

(30) Foreign Application Priority Data
Apr. 8, 2008  (EP) .................................. 08103446

(51) Int. Cl.
*G01B 7/14* (2006.01)
(52) U.S. Cl.
USPC ............. 324/207.22; 324/207.21; 324/251; 324/207.11; 324/207.2; 324/207.13
(58) Field of Classification Search
USPC .......... 324/207.21, 207.22, 207.26, 173–174, 324/160, 207.11, 207.15, 207.16, 207.23, 324/207.24, 207.25, 228, 207.2, 251, 249; 384/446, 448, 490, 494, 548, 482, 485; 327/510, 511
See application file for complete search history.

(56) References Cited

U.S. PATENT DOCUMENTS

| | | | |
|---|---|---|---|
| 4,752,733 A | 6/1988 | Petr et al. | |
| 5,747,995 A | 5/1998 | Spies | |
| 5,874,848 A | 2/1999 | Drafts et al. | |
| 6,064,202 A * | 5/2000 | Steiner et al. | 324/251 |
| 6,542,068 B1 | 4/2003 | Drapp et al. | |
| 6,545,462 B2 | 4/2003 | Schott et al. | |

(Continued)

FOREIGN PATENT DOCUMENTS

| CH | 664632 A5 | 3/1988 |
|---|---|---|
| DE | 10062292 A1 | 3/2002 |

(Continued)

OTHER PUBLICATIONS

International Preliminary Report on Patentability for PCT/EP2009/054225 dated Oct. 12, 2010.

(Continued)

*Primary Examiner* — Arleen M Vazquez
*Assistant Examiner* — Son Le
(74) *Attorney, Agent, or Firm* — Nixon Peabody LLP; David B. Ritchie

(57) ABSTRACT

A magnetic field sensor for measuring a direction of a magnetic field in a plane having two sensing structures (1A; 1B) that can be operated as a rotating Hall element. The two Hall elements are rotated in discrete steps in opposite directions. Such a magnetic field sensor can be used as current sensor for measuring a primary current flowing through a conductor (15).

17 Claims, 5 Drawing Sheets

(56) References Cited

U.S. PATENT DOCUMENTS

| | | |
|---|---|---|
| 7,038,448 B2 | 5/2006 | Schott et al. |
| 7,235,968 B2 | 6/2007 | Popovic et al. |
| 7,259,556 B2 | 8/2007 | Popovic et al. |
| 2003/0155912 A1 | 8/2003 | Motz |
| 2006/0011999 A1 | 1/2006 | Schott et al. |
| 2006/0152388 A1 | 7/2006 | Legrand |
| 2009/0121707 A1 | 5/2009 | Schott |
| 2010/0164491 A1* | 7/2010 | Kejik et al. .................. 324/251 |

FOREIGN PATENT DOCUMENTS

| | | |
|---|---|---|
| EP | 0766066 A1 | 4/1997 |
| EP | 0954085 A1 | 11/1999 |
| EP | 1182461 A2 | 2/2002 |
| EP | 1260825 A | 11/2002 |
| EP | 1387179 A2 | 2/2004 |
| EP | 1637898 A1 | 3/2006 |
| EP | 1739444 A2 | 1/2007 |
| EP | 2000813 A1 | 12/2008 |
| JP | 2002333456 A | 11/2002 |
| WO | WO 98/10302 A2 | 3/1998 |
| WO | WO 2004/013645 A1 | 2/2004 |
| WO | WO 2004/025742 A1 | 3/2004 |
| WO | WO 2005/029106 A1 | 3/2005 |
| WO | WO 2005/073744 A1 | 8/2005 |
| WO | WO 2006/074989 A2 | 7/2006 |
| WO | WO 2008/030129 A2 | 3/2008 |

OTHER PUBLICATIONS

P.J.A. Munter, "A Low-Offset Spinning-Current Hall Plate," Sensors and Actuators A, Elsevier Sequoia S.A., Lausanne, CH, vol. A22, No. 1, Mar. 3, 1990, pp. 743-746, XP000358524, ISSN: 0924-4247.

P.J.A. Munter, "Electronic Circuitry for a Smart Spinning-Current Hall Plate with Low Offset," Sensors and Actuators A, Elsevier Sequoia S.A., Lausanne, CH, vol. A27, No. 1-3, May 1991, pp. 747-751, XP000216815, ISSN: 0924-4247.

Sandra Bellekom, et al., "Offset Reduction of Hall Plates in Three Different Crystal Planes," Sensors and Actuators A, Elsevier Sequoia S.A., Lausanne, CH, vol. 66, No. 1-3, Apr. 1998, pp. 23-28, XP004143964, ISSN: 0924-4247.

R.S. Popovic, "Not-Plate-Like Hall Magnetic Sensors and their Applications," Sensors and Actuators A, Elsevier Sequoia S.A., Lausanne, CH, vol. 85, No. 1-3, Aug. 2000, pp. 9-17, XP004214441, ISSN: 0924-4247.

Eric Favre, "Capteurs de Courant: a Chacun son Argument," Mesures, No. 763, Mar. 2004.

P.L.C. Simon, "Autocalibration of Silicon Hall Devices," Transducers '95, Eurosensors IX, 8$^{th}$ International Conference on Solid-State Sensors and Actuators, Stockholm, Sweden, 291-Al2, pp. 337-240, Jun. 1995.

Janez Trontelj, "Optimization of Integrated Magnetic Sensor by Mixed Signal Processing," IEEE Instrumentation and Measurement Technology Conference, vol. 1, pp. 299-302, May 1999.

Michael Demierre, "Improvements of CMOS Hall Microsystems and Application for Absolute Angular Position Measurements," PhD Thesis, EPFL, Sep. 2003.

P. Kejik, et al., "Circular Hall Transducer for Angular Position Sensing," Transducers & Eurosensors '07. XXI Conference, Jun. 10-14, 2007, Lyon, France, Digest of Technical Papers vol. 2, pp. 2593-2596.

P. Kejik, et al., "A New Compact 2D Planar Fluxgate Sensor with Amorphous Metal Core," Sensors and Actuators A: Physical, vol. 81, Issues 1-3, Apr. 2000, pp. 180-183.

Toshikatsu Sonoda, et al., "An AC and DC Current Sensor of High Accuracy," IEEE Transactions on Industry Applications, IEEE Service Center, Piscataway, NJ, US, vol. 28, No. 5, Sep. 1992, pp. 1087-1093, XP000311409, ISSN: 0093-9994.

F. Burger, et al., "New fully integrated 3-D silicon Hall sensor for precise angular-position measurements," Sensors and Actuators A: Physical, vol. 67, Issues 1-3, pp. 72-76, May 1998.

Vincent Hiligsmann, et al., "Monolithic 360 Degrees Rotary Position Sensor IC," Proceedings of IEEE Sensors 2004, vol. 3, pp. 1137-1142, Oct. 2004.

Novotechnik U S , Inc., "Vert-X Technology," 1 page, Dec. 2001.

M. Paranjape, et al., "A CMOS-compatible 2-D vertical Hall magnetic-field sensor using active carrier confinement and post-process micromachining," Sensors and Actuators A: Physical, vol. 53, Issues 1-3, pp. 278-283, May 1996.

CH.S. Roumenin, "Magnetic sensors continue to advance towards perfection," Sensors and Actuators A: Physical, vol. 46, Issues 1-3, pp. 273-279, Jan.-Feb. 1995.

Chavdar Roumenin, et al., "Vertical Hall Effect Devices in the Basis of Smart Silicon Sensors," IEEE Workshop on Intelligent Data Acquisition and Advanced Computing Systems: Technology and Applications, pp. 55-58, Sep. 5-7, 2005.

Sentron, "Angular position sensing with 2-Axis Hall IC 2SA-10," pp. 1-7, Feb. 12, 2004.

Jack E. Volder, "The CORDIC Trigonometric Computing Technique," IRE Transactions on Electronic Computers, pp. 330-334, Sep. 1959.

International Search Report for PCT/EP2009/054225 dated Jul. 9, 2009.

International Search Report for PCT/EP2008/056517 dated Jul. 17, 2008.

* cited by examiner

MAGNETIC FIELD SENSOR MEASURING A DIRECTION OF A MAGNETIC FIELD IN A PLANE AND CURRENT SENSOR

CROSS REFERENCE TO RELATED APPLICATIONS

The present application is a National Phase Application of and claims priority to PCT patent application no. PCT/EP2009/054225 entitled "MAGNETIC FIELD SENSOR MEASURING A DIRECTION OF A MAGNETIC FIELD IN A PLANE AND CURRENT SENSOR", filed Apr. 8, 2009, which in turn claims priority to European patent application no. 08103446.4 filed Apr. 8, 2008, the entireties of which are hereby incorporated by reference.

The present application is also related to U.S. patent application Ser. No. 12/601,818, filed Nov. 24, 2009, which is a National Phase Application of PCT/EP2008/056517 entitled "MAGNETIC FIELD SENSOR FOR MEASURING DIRECTION OF A MAGNETIC FIELD IN A PLANE", filed May 28, 2008, which claims priority to European patent application no. 07109063.3 filed May 29, 2007, the entireties of which are hereby incorporated by reference.

FIELD OF THE INVENTION

The invention concerns a magnetic field sensor measuring a direction of a magnetic field in a plane and a current sensor having such a magnetic field sensor.

BACKGROUND OF THE INVENTION

The measurement principle of the present invention is based on the one hand on the measurement of a magnetic field produced by the current to be measured which is called the primary current and on the other hand on the measurement of an auxiliary magnetic field produced by a secondary current flowing through a coil. The current sensor therefore comprises a magnetic field sensor, such as e.g. a Hall device, a fluxgate sensor or a magnetoresistive sensor like an AMR or GMR sensor. In the prior art, the magnetic field produced by the current to be measured and the auxiliary magnetic field produced by the secondary current flowing through the coil run in the same direction and the magnetic sensor is a single axis sensor the sensitive axis of which is collinear with this direction. The prior art distinguishes mainly between two different implementations of this measurement principle. With the first implementation which is called open-loop type, the auxiliary magnetic field is used to calibrate the magnetic field sensor. The drawback of this implementation is that the value of the auxiliary magnetic field is low, that the auxiliary magnetic field runs in the same direction as the primary current's magnetic field, which makes it difficult to selectively measure it in a signal comprising both the primary current's magnetic field and the auxiliary magnetic field. With the second implementation which is called closed-loop type the auxiliary magnetic field is used to compensate the magnetic field produced by the current to be measured. An advantage of this second implementation is that the output signal of the current sensor does not depend on the characteristics of the magnetic field sensor but the drawback is that the auxiliary magnetic field must be of equal size as the magnetic field produced by the primary current. A closed-loop current sensor without a magnetic yoke, where the electrical signal containing the information on the measured magnetic field is counterbalanced by the electrical signal containing the information on a reference field created by a current flowing through a reference coil is known from JP 2001136921.

DISCLOSURE OF THE INVENTION

The object of the invention is to develop a current sensor without the above named drawbacks.

In the following, the terms "primary current" and "primary magnetic field" are used to designate the magnetic field produced by the current to be measured, and the terms "reference current" and "reference magnetic field" are used to designate the auxiliary magnetic field and the current running through a coil to produce the auxiliary magnetic field. The primary magnetic field and the reference magnetic field add up to a total magnetic field. The present invention proposes to align the reference magnetic field with a different direction, preferably perpendicularly, to the primary magnetic field and to use a magnetic field sensor which measures the direction of the total magnetic field or the angle which the total magnetic field includes with the direction defined by the reference magnetic field, respectively. The magnetic field sensor delivers one output signal. The current sensor further comprises electronic circuitry for the operation of the magnetic field sensor and for the generation of the reference magnetic field, preferably for the operation in the so-called open-loop.

The magnetic field sensor is designed for measuring a direction of a magnetic field in a plane and comprises a first sensing structure and a second sensing structure, each comprising
a ring-shaped, electrically conductive well, and
a predefined number N of at least eight contacts of equal size placed at equal distance from each other along the ring-shaped well and contacting the ring-shaped well, and
an electronic circuit comprising
at least one current source,
a first processing block for processing a first Hall voltage, a second processing block for processing a second Hall voltage, and an exclusive OR gate having a first and a second input, each processing block comprising a voltage difference amplifier, a bandpass filter and a comparator, wherein an output of the first and second processing block is coupled directly or indirectly to the first or the second input of the exclusive OR gate,
a switching block comprising a first plurality of electronic switches associated with the contacts of the first sensing structure and a second plurality of electronic switches associated with the contacts of the second sensing structure,
a timing circuit providing a clock signal for opening and closing the switches of the switching blocks and according to a predetermined time scheme such that a predetermined number of contacts of the plurality of contacts of the first sensing structure form a first Hall element moving in a clockwise direction along the ring-shaped well of the first sensing structure in a predefined number of steps per turn and such that a predetermined number of contacts of the plurality of contacts of the second sensing structure form a second Hall element moving in a counterclockwise direction along the ring-shaped well of the second sensing structure in the same predefined number of steps per turn, wherein the first and second Hall element are supplied with current from the at least one current source and deliver each at least one Hall voltage to the processing blocks.

Preferably, the number N of contacts is eight and the first switching block is adapted to close and open the first plurality of electronic switches such that at each step all eight contacts of the first sensing structure are connected either to the at least one current source or directly or indirectly to one of the processing blocks, and the second switching block is adapted to close and open the second plurality of electronic switches such that at each step all eight contacts of the second sensing structure are connected either to the at least one current source or directly or indirectly to one of the processing blocks.

The switching blocks are preferably configured to move the first Hall element and the second Hall element along their respective ring-shaped well in turns consisting of 8 steps or in turns consisting of 4 steps.

Preferably, each step comprises a number of two or four sub-steps wherein the contacts for feeding the current and the contacts for measuring the respective Hall voltage are exchanged according to the so-called spinning current method.

Preferably, at least one further switching block for alternately exchanging the first and second processing block is provided.

A current sensor for measuring a primary current flowing through a conductor can be formed of such a magnetic field sensor, a coil and a current source feeding a reference current to the coil. The windings of the coil are oriented with respect to a direction of the primary current such that a primary magnetic field generated by the primary current and a reference magnetic field generated by the reference current include an angle β that is different from zero. The current sensor further comprises an electronic circuit coupled to the output of the exclusive OR gate of the magnetic field sensor that generates an output signal proportional to the primary current.

This electronic circuit can for example be an analog circuit comprising an integrator configured to generate an output signal proportional to the tangent function, the integrator comprising an operational amplifier, a number of M switches and resistors, and a capacitor, wherein the M switches and resistors are arranged as parallel sets of one switch and one resistor arranged in series having one terminal of the switch connected to a voltage source and one terminal of the resistor connected to an input of the operational amplifier.

With a magnetic field sensor with which the number of contacts of the first sensing structure is eight, the number of contacts of the second sensing structure is eight and which is operated such that the Hall elements complete each term in four steps and with individual amplification factors of the amplifiers and/or individual currents flowing through the Hall elements in each step it is possible to achieve a high accuracy even if the reference magnetic field is small compared to the primary magnetic field.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE INVENTION

Figure 1:
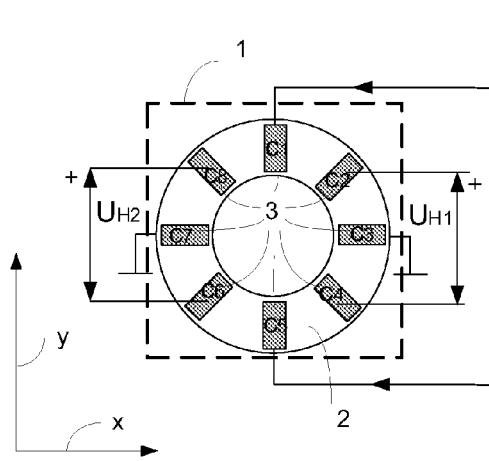
FIG. 1, 2 show a planar sensing structure operateable as moving Hall element in different operating conditions.

FIG. 1 shows a planar sensing structure 1 consisting of a ring-shaped, electrically conductive well 2 and a number N of at least eight contacts 3 of equal size placed at equal distance from each other along the ring-shaped well 2 and contacting the ring-shaped well 2. The ring-shaped well 2 has a first conductivity type and is embedded in a well or a substrate of a second conductivity type. The sensing structure 1 lies in a plane, the axis of which are designated as x and y. Such a sensing structure 1 and its operation as a moving Hall element are known from the international patent application WO 2008145662. With a preferred embodiment, as shown in FIG. 1, the number N of the contacts 3 is N=8. The eight contacts 3 are labeled as $C_1$ to $C_8$. In this embodiment, the eight contacts 3 are—as seen from the center of the ring-shaped well 2—angularly displaced by 45°.

Although the number N of the contacts 3 is very small, five contacts lying adjacent each other, i.e. a first, second, third, fourth and fifth contact, are combined to form a vertical Hall element in that a current is supplied to the first and the fifth contact and discharged from the third contact and in that a Hall voltage $U_{H1}$ appearing between the second and the fourth contact is measured. The vertical Hall element thus formed is then moved in steps along the ring-shaped well 2, either in the clockwise direction or in the counterclockwise direction. The number of steps to complete one turn is equal to the number N of contacts 3. So when moving in the clockwise direction, in the first step the contacts labeled $C_1$ to $C_5$ form the vertical Hall element, in the second step, the contacts labeled $C_2$ to $C_6$ form the vertical Hall element, and so on. For doing so, a current source 4, which is preferably a DC current source, a voltage difference amplifier 5, which is preferably a differential difference amplifier, a switching block 6 comprising a plurality of electronic switches associated with the contacts 3 and a timing circuit 7 providing a clock signal for controlling the switches of the switching block are provided. The switches of the switching block 6 are opened and closed according to a predetermined time scheme to connect the five neighboring contacts of the vertical Hall element to the current source 4 and the voltage difference amplifier 5 as required in each step or, if the spinning current method is applied as explained below, each sub-step.

The number N=8 of contacts 3 allows another, more efficient mode of operation. As can be seen in FIG. 1, the first and fifth contact always lie opposite each other. Therefore, the fifth, sixth, seventh, eighth and first contact can be combined to a second vertical Hall element. As can be seen, the first and fifth contact belong to both vertical Hall elements. In this case, the current is supplied to the first and the fifth contact and discharged from the third and seventh contact, and a first Hall voltage $U_{H1}$ appearing between the second and the fourth contact and a second Hall voltage $U_{H2}$ appearing between the eighth and the sixth contact are sensed. The two Hall voltages $U_{H1}$ and $U_{H2}$ are first fed each to a voltage difference amplifier and then added in a summing junction. So when moving in the clockwise direction in the first step, the contacts labeled $C_1$ to $C_5$ form the first vertical Hall element and the contacts labeled $C_5$ to $C_8$ and $C_1$ form the second vertical Hall element, in the second step, the contacts labeled $C_2$ to $C_6$ form the first vertical Hall element and the contacts labeled $C_6$ to $C_8$, $C_1$ and $C_2$ form the second vertical Hall element, and so on.

The first and second vertical Hall element share some current contacts. Therefore the eight contacts 3 of the sensing structure 1 can be considered to form one single Hall element that is supplied with a current and that is rotated in a number of N steps during operation wherein each contact is either connected to the current source or to an amplifier. This Hall element delivers the two Hall voltages $U_{H1}$ and $U_{H2}$ which have—apart from measurement errors and manufacturing tolerances—the same magnitude. Therefore these two Hall voltages $U_{H1}$ and $U_{H2}$ can be processed by two voltage difference amplifiers and the outputs of them can be added in a summing junction to deliver a single processed Hall voltage $U_H$ ready for further processing.

Figure 2:
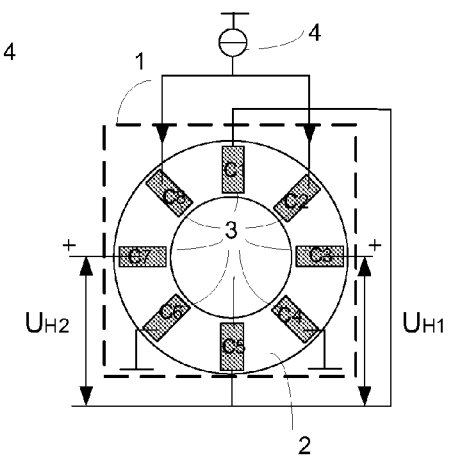

In order to reduce the offset of the Hall element(s), the well known spinning current method is preferably applied. This means, that each step is divided into two or four sub-steps, wherein the current and voltage contacts are exchanged. While FIG. 1 shows the switching configuration of the first sub-step of the first step, FIG. 2 shows the switching configuration of the second sub-step of the first step. In this second sub-step, the current is supplied to the contacts labeled $C_2$ and $C_8$ and discharged from the contacts $C_4$ and $C_6$, the first Hall voltage is measured between the contact $C_3$ and the short-circuited contacts $C_1$ and $C_5$ and the second Hall voltage is measured between the contact $C_7$ and the short-circuited contacts $C_1$ and $C_5$. If the number of sub-steps is four, then in sub-step 3 the current flows in the reverse direction and the voltage contacts are exchanged with respect to sub-step 1 and in sub-step 4 the current flows in the reverse direction and the voltage contacts are exchanged with respect to sub-step 2. So the number of steps to rotate the Hall element is still N=8, but the total number of switching cycles is either 2*8=16 or 2*4=32.

Figure 3:
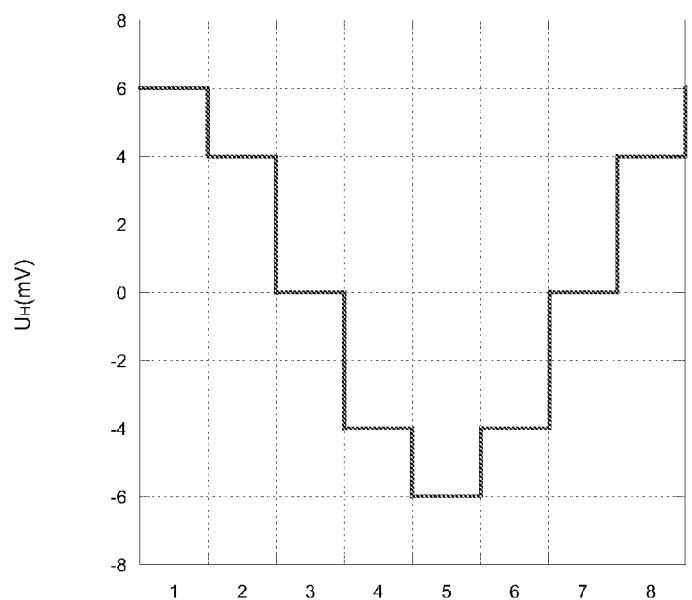
FIG. 3 shows a Hall voltage diagram.

FIG. 3 shows the Hall voltage $U_H$ appearing at each of the N=8 steps during one complete turn if a magnetic field pointing into the x-direction is applied. The Hall voltage $U_H$ is a step cosine wave (approximation of a cosine wave). Similarly, the Hall voltage $U_H$ is a step sine wave if the applied magnetic field points into the y-direction. Finally, the Hall voltage $U_H$ induced by any in-plane magnetic field is a linear combination of a step sine wave and a step cosine wave.

Figure 4:
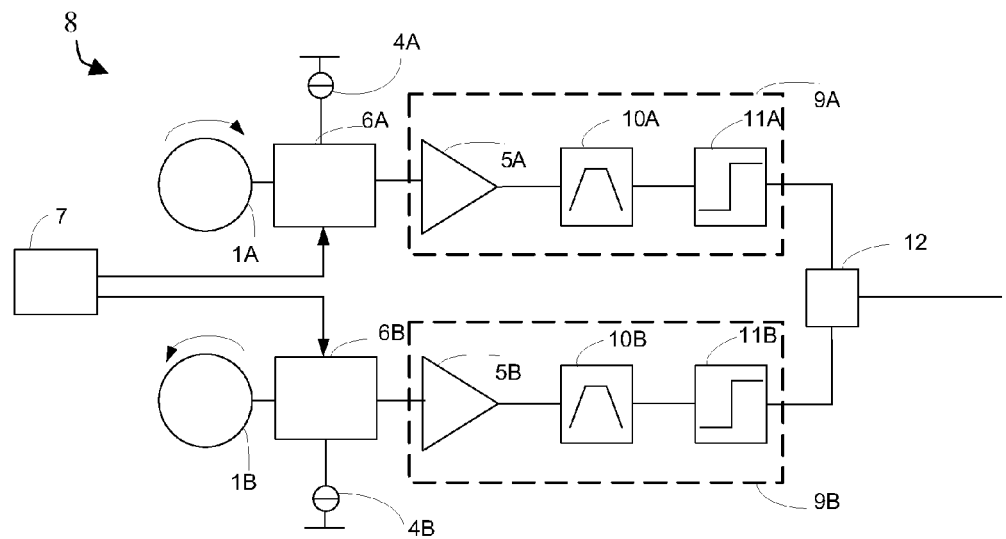
FIG. 4 shows a block scheme of an angle sensor comprising two sensing structures.

The sensing structure 1 of FIG. 1 can be combined with electronic circuitry to form an angle sensor wherein the angle sensor delivers an output signal that is proportional to the angle α that a magnetic field lying in the xy-plane includes with the x-axis. The angle sensor is therefore a magnetic field sensor for measuring a direction of a magnetic field in a plane. In a preferred embodiment, the angle sensor comprises two sensing structures 1A and 1B wherein the first sensing structure 1A is operated as a Hall element moving in the clockwise direction and the second sensing structure 1B is operated as a Hall element moving in the counterclockwise direction. FIG. 4 shows a block scheme of such an angle sensor 8 with the complete electronic circuit. The angle sensor 8 essentially comprises the first sensing structure 1A, a first switching block 6A, a first processing block 9A comprising a first voltage difference amplifier 5A, a first bandpass filter 10A and a first comparator 11A, the second sensing structure 1B, a second switching block 6B, a second processing block 9B comprising a second voltage difference amplifier 5B, a second bandpass filter 10B and a second comparator 11B, a timing circuit 7, a first current source 4A and a second current source 4B. As each of the sensing structures 1A and 1B delivers two Hall voltages $U_{H1}$ and $U_{H2}$, the first and second voltage difference amplifiers 5A and 5B are configured to process both Hall voltages $U_{H1}$ and $U_{H2}$ and provide an output signal that is proportional to their sum. The output signals of the two processing blocks 9A and 9B are fed to an exclusive OR gate 12 having two inputs and an output. The exclusive OR gate 12 delivers an output signal that is a pulse width modulated (PWM) signal. With this example, the outputs of the processing blocks 9A and 9B are coupled directly to the inputs of the exclusive OR gate 12.

The first switching block 6A comprises a first plurality of electronic switches associated with the contacts 3 of the first sensing structure 1A and the second switching block 6B comprises a second plurality of electronic switches associated with the contacts 3 of the second sensing structure 1B. The timing circuit 7 provides a clock signal for opening and closing the switches of the switching blocks 6A and 6B according to a predetermined time scheme, so that the eight contacts 3 of the sensing structures 1A and 1B are connected either to the constant current sources 4A and 4B or to the processing blocks 9A and 9B as described above in order to move a first Hall element in clockwise direction along the ring-shaped well 2 of the first sensing structure 1A and a second Hall element in the counterclockwise direction along the ring-shaped well 2 of the second sensing structure 1B. Each Hall element delivers two Hall voltages $U_{H1}$ and $U_{H2}$ which are processed and added to a sum Hall voltage $U_H$ in the respective voltage difference amplifier 5A or 5B of the first or second processing block 9A or 9B. The Hall elements may be supplied with current from one single current source or as shown from different current sources 4A and 4B.

Figure 5:
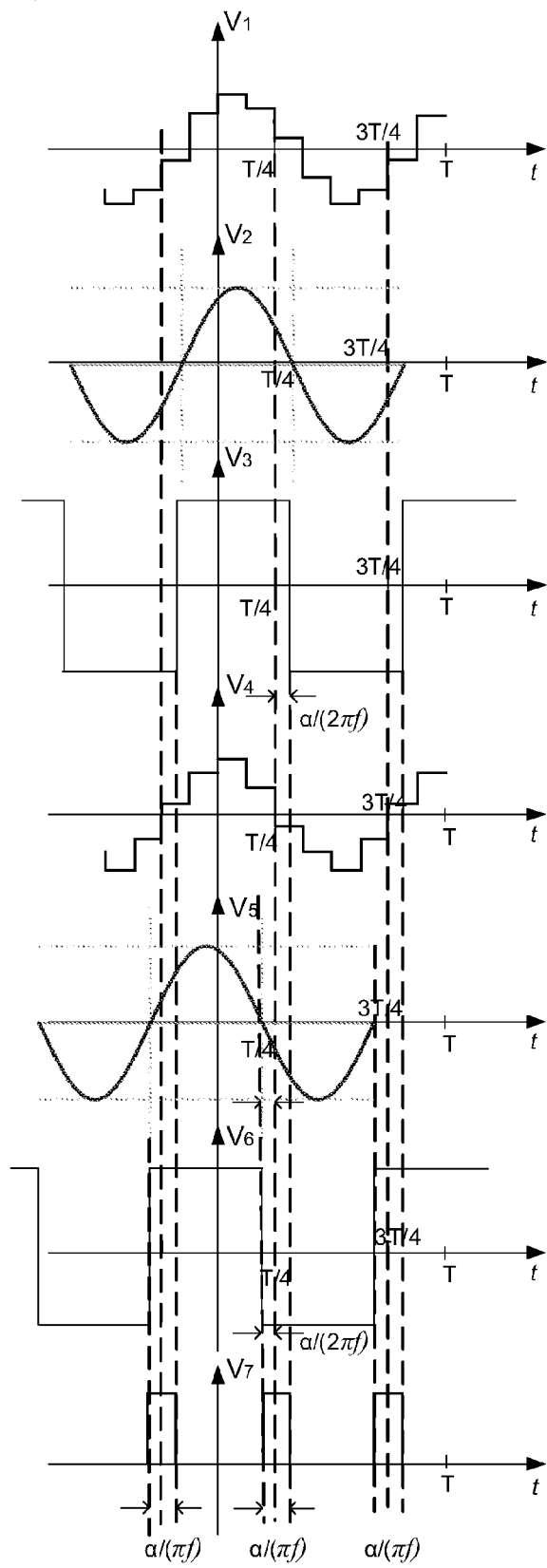
FIG. 5 shows different voltage diagrams.

FIG. 5 shows different voltages $V_1$ to $V_7$ appearing within the processing blocks 9A and 9B and at the output of the exclusive OR gate 12 as a function of time t. These voltages are:

$V_1$ voltage appearing at the output of the first voltage difference amplifier 5A, $V_2$ voltage appearing at the output of the first bandpass filter 10A, $V_3$ voltage appearing at the output of the first comparator 11A, $V_4$ voltage appearing at the output of the second voltage difference amplifier 5B, $V_5$ voltage appearing at the output of the second bandpass filter 10B, $V_6$ voltage appearing at the output of the second comparator 11B, $V_7$ voltage appearing at the output of the exclusive OR gate 12.

The voltages $V_2$ and $V_5$ are given by $$V_2 = A_1 * S_1 * B * I_{H1} * \cos(2\pi * f * t - \alpha),$$

$$V_5 = A_2 * S_2 * B * I_{H2} * \cos(2\pi * f * t + \alpha),$$

$$V_7 = \text{rectangular pulses of width } \alpha/(\pi * f)$$

wherein α denotes the angle the magnetic field in the xy-plane includes with the x-axis, f denotes the frequency=number of rotations of the Hall elements per unit time, $A_1$ and $A_2$ denote the amplification factors (gain) of the amplifiers 5A and 5B, $S_1$ and $S_2$ denote the sensitivities of the sensing structures 1A and 1B and $I_{H1}$ and $I_{H2}$ denote the currents flowing through the sensing structures 1A and 1B, respectively. T is 1/f. The processing blocks 9A and 9B are preferably matched to have $A_1 = A_2$. The sensitivities are the same $S_1 = S_2$. This preferred angle sensor 8 has the advantage that the pulses appearing at the output of the exclusive OR gate 12 are independent of the amplifiers' 5A and 5B gains and temperature drifts.

Figure 6:
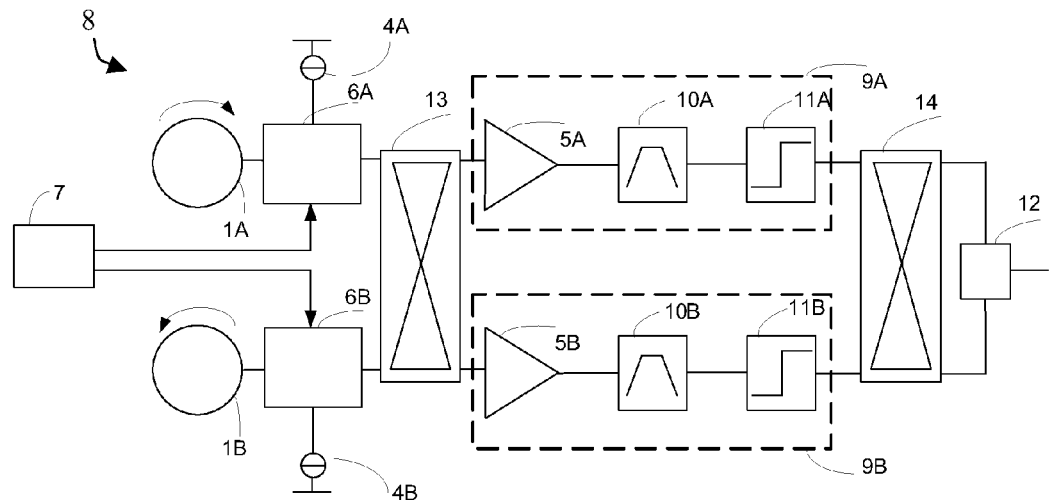
FIG. 6 shows a block scheme of a further angle sensor.

The processing blocks 9A and 9B may each introduce a certain delay, so that the pulses appearing at the output of the comparators 11A and 11B are shifted slightly in time. If the processing blocks 9A and 9B are matched and have the delays $\phi_1$ and $\phi_2$, respectively, the voltages $V_2$ and $V_5$ are $$V_2 = A_1 * S_1 * B * I_{H1} * \cos(2\pi * f * t - \alpha + \phi_1),$$

$$V_5 = A_2 * S_2 * B * I_{H2} * \cos(2\pi * f * t + \alpha + \phi_2),$$

and the width of the pulses $\alpha/(\pi*f)$ is independent of the delays if $\phi_1 = \phi_2$. In order to have $\phi_1 = \phi_2$ it is preferred to exchange the two processing blocks 9A and 9B periodically, e.g. after each complete turn of the Hall elements. FIG. 6 shows an angle sensor 8 having at least one further switching block 13 located before the processing blocks 9A and 9B or two further switching blocks 13 and 14 located before and after the processing blocks 9A and 9B. The switching block(s) 13 and 14 exchange the processing blocks 9A and 9B periodically. With this example, the outputs of the processing blocks 9A and 9B are coupled indirectly—via the switching block 14—to the inputs of the exclusive OR gate 12.

Figure 7:
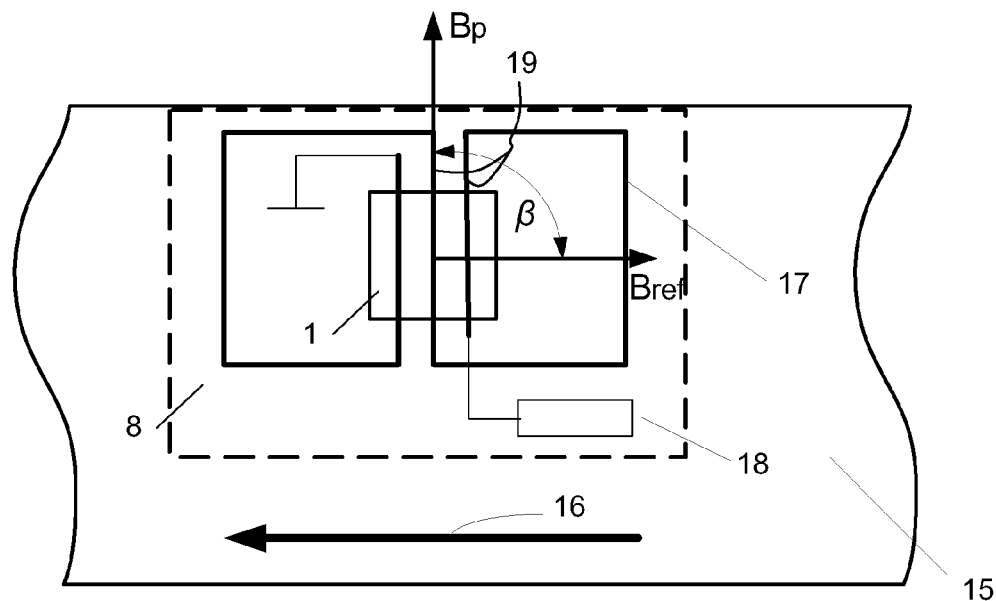
FIG. 7 shows an assembly group for current measurement.

FIG. 7 shows the application of such an angle sensor for the measurement of a current. The angle sensor 8 is located on a flat electrical conductor 15 through which the current to be measured, i.e. the primary current, flows. The primary current flows along the conductor 15 in a direction designated by an arrow 16 and produces a primary magnetic field $B_p$. The angle sensor 8 is integrated in a semiconductor chip that is located in a conventional manner above the conductor 15. A reference current $I_{ref}$ flowing through a coil 17 produces a reference magnetic field $B_{ref}$. The coil 17 is preferably a flat coil consisting of conventional conductor tracks 19 formed on the semiconductor chip, above the sensing structure 1. The windings of the conductor tracks 19 are oriented so that the reference magnetic field $B_{ref}$ points in a direction that is different from the direction of the primary magnetic field $B_p$. The primary magnetic field $B_p$ and the reference magnetic field $B_{ref}$ include a fixed angle $\beta$ that is different from zero. Preferably, the angle $\beta$ amounts to $\beta=90°$ as shown in this example. The conductor 15 and the angle sensor 8 form an assembly group for current measurement. With reference to FIG. 1, the angle sensor 8 and the coil 17 are oriented such that the reference magnetic field $B_{ref}$ produced by the current $I_{ref}$ flowing through the coil 17 points into the x-direction and the primary magnetic field $B_p$ produced by the current $I_p$ to be measured points into the y-direction. The angle $\alpha$ denotes the angle the total magnetic field $B=B_{ref}+B_p$ includes with the reference magnetic field $B_{ref}$.

The angle $\alpha$ is given by the equation $$\tan \alpha = B_p/B_{ref} = k_1 * I_p/(k_2 * I_{ref})$$

wherein $k_1$ and $k_2$ are constants depending on the vacuum magnetic permittivity and the geometries of the conductor 15 and the coil 17, respectively. The current $I_{ref}$ flowing through the coil 17 is generated with a current source 18 which is for example a voltage source delivering a constant reference voltage $V_{ref}$ and a reference resistor $R_{ref}$ as $$I_{ref} = V_{ref}/R_{ref}$$

and one gets $$I_p = k_2 * V_{ref}/(k_1 * R_{ref}) * \tan \alpha$$

Figure 8:
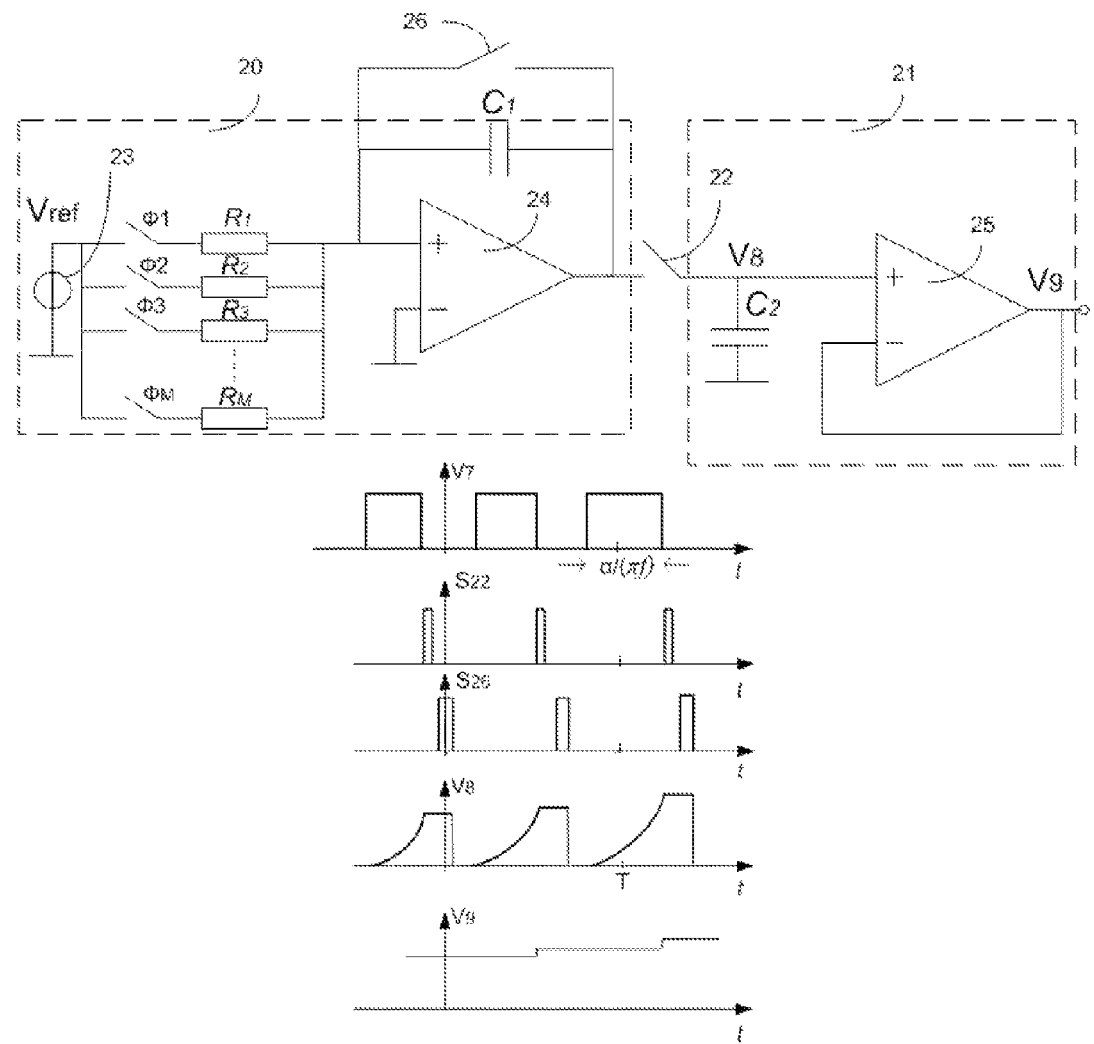
FIG. 8 shows an analog circuit for generating the tangent function.

The output of the exclusive OR gate 12 delivers pulses of width (or length) $\alpha/(\pi*f)$. The value $\tan \alpha$ can be determined in different ways, for example by the use of a digital block or an A/D-converter in combination with a lookup table, and so on. FIG. 8 illustrates a preferred way using an analog circuit that uses the pulses of width $\alpha/(\pi*f)$ of the pulse width modulated signal $V_7$ to create $\tan \alpha$ as a function of the angle $\alpha$. FIG. 8 shows the analog circuit and several diagrams.

The analog circuit comprises an integrator 20, a sample and hold circuit 21, a first switch 22 coupling the output of the integrator 20 to the input of the sample and hold circuit 21 and a second switch 26 which allows a reset of the integrator 20 at specified times. The integrator 20 comprises a voltage source 23, an operational amplifier 24, a number of M switches $\Phi_1$ to $\Phi_M$ and resistors $R_1$ to $R_M$, and a capacitor $C_1$. The M switches $\Phi_1$ to $\Phi_M$ and resistors $R_1$ to $R_M$ are arranged as parallel sets of one switch and one resistor arranged in series having one terminal of the switch connected to the voltage source 23 and one terminal of the resistor connected to an input of the operational amplifier 24. The sample and hold circuit 21 comprises a capacitor $C_2$ and an operational amplifier 25. The switches 22 and 26 are open most of the time and only closed for a short period of time as described further below.

At the beginning, all the switches $\Phi_1$ to $\Phi_M$ are open and the capacitor C is discharged. The voltage at the output of the operational amplifier 24 is zero. At time $t_0$, the switch $\Phi_1$ is closed, so that a current $I_1 = V_{ref}/R_1$ flows through the resistor $R_1$ and charges the capacitor $C_1$. At time $t_1$, the switch $\Phi_2$ is closed, so that a current $I_2 = V_{ref}/(R_1 \| R_2)$ charges the capacitor $C_1$. At time $t_2$, the switch $\Phi_3$ is closed, so that a current $I_3 = V_{ref}/(R_1 \| R_2 \| R_3)$ charges the capacitor $C_1$. The times $t_1$, $t_2$ to $t_M$ form successive time intervals $t_0$ to $t_1$, $t_1$ to $t_2$, ... $t_{M-1}$ to $t_M$. The times $t_1$, $t_2$ to $t_M$ and the resistors $R_1$ to $R_M$ are selected such that the current charging the capacitor $C_1$ in each time interval is proportional to the first derivative of $\tan(t)$ at an appropriate point in that time interval. As this analog circuit 20 is a classical integrator, the voltage at the output of the operational amplifier 24 is proportional to $\tan(t)$.

The voltage signal $V_7$ controls the operation of the analog circuit 20. However, the time scale of the integrator 20 has to be matched to the time scale of the pulse width modulated signal $V_7$. The beginning of a pulse of the voltage signal $V_7$ triggers the start of the integrator 20, i.e. time $t_0$ occurs when the voltage $V_7$ changes its state from low to high. The switches $\Phi_1$ to $\Phi_M$ are closed one after the other at the predetermined times $t_0$ to $t_{M-1}$. However, at the end of the pulse, i.e. when the voltage $V_7$ changes its state from high to low, this process is finished and all the switches $\Phi_1$ to $\Phi_M$ are opened. The voltage at the output of the operational amplifier 24 has now the value $k_1/(k_2*C_1)*I_p$.

The switch 22 is closed for a short period of time at the end of each pulse, i.e. when the voltage $V_7$ changes its state from high to low, in order to transfer the actual voltage at the capacitor $C_1$ to the capacitor $C_2$. After the switch 22 has been opened again, the switch 26 is closed for a short period of time in order to discharge the capacitor $C_1$ which resets the output voltage of the integrator 20 to zero.

The diagrams of FIG. 8 show the voltage $V_7$ at the output of the exclusive OR-gate 12 (FIG. 4), the state $S_{22}$ and $S_{26}$ of the switches 22 and 26 (high=closed, low=open), the voltage $V_8$ at the output of the integrator 20 and the voltage $V_9$ at the output of the sample and hold circuit 21. With this example the width of the three successive pulses of $V_7$ increases. Therefore the voltages $V_8$ and $V_9$ achieve a successively higher level.

The function $\tan(t)$ can be approximated to a good degree in the interval from $t=0$ to $t=\pi/(4*2*\pi*f)=1/(8*f)$ with as few as M=6 resistors with an error of approximation of the function $\tan(t)$ of less than 1.25%. If the function $\tan(t)$ needs to be generated for angles that are larger than $\pi/4$ the number M of resistors and time intervals is bigger.

Figure 9:
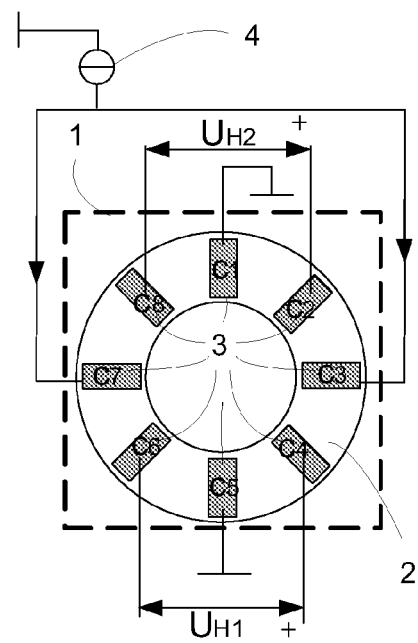
FIG. 9 shows the planar sensing structure in a certain operating conditions.

The angle α depends on the ratio $k_1*I_p/(k_2*I_{ref})$. In order to have the angle α between 0 and π/4, the reference current $I_{ref}$ must be higher than the primary current $I_p$ to be measured if $k_1=k_2$. This condition can not always be fulfilled because the maximum reference current allowed to flow through the coil 17 is limited. However, there is a solution to overcome this problem in that the Hall voltage is sampled only in those steps during the rotation of the Hall element where the Hall voltage contains information only on $B_p$ or only on $B_{ref}$. Among the N=8 steps of one turn there are two steps where the Hall voltage contains information only on $B_p$, and two steps where the Hall voltage contains information only on $B_{ref}$. Therefore, the Hall element is rotated in only four steps along the ring-shaped well 2. When rotating in N=8 steps, the vertical Hall elements formed in two successive steps are displaced by the distance between two adjacent contacts 3, i.e. they are rotated by an angle of 360°/8=45°. When rotating in N=4 steps, the vertical Hall elements formed in two successive steps are displaced by twice the distance between two adjacent contacts 3, i.e. they are rotated by an angle of 360°/4=90°. In the first step, the eight contacts 3 are connected to the current source 4 and to the voltage difference amplifier 5 as shown in FIG. 1. The sensitive structure 1 now measures the magnetic field $B_{ref}$. In the second, third and fourth step, the eight contacts 3 are connected to the current source 4 and to the voltage difference amplifier 5 as shown in FIG. 9. The sensitive structure 1 now measures the magnetic field $B_p$. In the third step, the sensitive structure 1 measures again the magnetic field $B_{ref}$, and in the fourth step, the sensitive structure 1 measures the magnetic field $B_p$. When the magnetic field $B_p$ is measured, i.e. in steps 2 and 4, the currents $I_{H1}$ and $I_{H2}$ are decreased by a factor h or the amplification factor of the amplifiers 5A and 5B is decreased by a factor h or a combination of both. (Or alternatively when the magnetic field $B_{ref}$ is measured, i.e. in steps 1 and 3, the currents $I_{H1}$ and $I_{H2}$ are increased by a factor h or the amplification factor of the amplifiers 5A and 5B is increased by a factor h or a combination of both.) The voltages $V_2$, $V_5$ and $V_7$ of the circuit shown in FIG. 4 are then $$V_2=A_1*S_1*B*I_{H1}*\cos(2\pi*f*t-\pi/4-\alpha_1),$$

$$V_5=A_2*S_2*B*I_{H2}*\cos(2\pi*f*t-\pi/4+\alpha_2),$$

$V_7$=rectangular pulses of width $\alpha_1/(\pi*f)$ with $$\tan \alpha_1=B_p/(h*B_{ref})$$

or $$I_p=h*k_2/k_1*I_{ref})*\tan \alpha_1$$

Therefore the circuits shown in FIGS. 4 and 8 can be used also in this case with small modifications like rotating the Hall element in N/2=4 steps, having individual amplification factors and/or currents through the Hall element as described above, and a modified scaling of the integrator 20 with respect to the pulses of the voltage $V_7$. In a preferred embodiment, however, the amplification factor of the operational amplifier 25 of the sample and hold circuit 21 is increased by the factor h, so that the voltage $V_9$ at the output of the sample and hold circuit 21 is $$V_9=k_2/k_1*I_{ref}$$

Instead of rotating the vertical Hall element in 4 steps with 90° of rotation per step, it would also be possible to only use steps 1 and 2 of these four steps, i.e. to switch back and forth between the first and the second connection scheme of the Hall element as shown in FIGS. 1 and 9. Furthermore, it would also be possible to rotate the vertical Hall element in 8 steps and to have individual amplification factors of the amplifiers 5A and 5B and/or individual currents flowing through the Hall element in each step.

One big advantage is that the small number of four or eight steps per turn makes the angle sensor and the current sensor very fast, because the time needed to get the information is short.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except by the appended claims and their equivalents.

The invention claimed is:

1. A magnetic field sensor for measuring a direction of a magnetic field in a plane, comprising:
    a first sensing structure and a second sensing structure, each comprising
        a ring-shaped, electrically conductive well, and
        a predefined number N of at least eight contacts of equal size placed at equal distance from each other along the ring-shaped well and contacting the ring-shaped well, and
    an electronic circuit comprising
        at least one current source,
        a first processing block for processing a first Hall voltage, a second processing block for processing a second Hall voltage, and an exclusive OR gate having a first and a second input, each processing block comprising a voltage difference amplifier having an output coupled to an input of a bandpass filter having an output coupled to an input of a comparator, wherein an output of the first processing block is coupled directly or indirectly to the first input of the exclusive OR gate and an output of the second processing block is coupled directly or indirectly to the second input of the exclusive OR gate,
        a switching block comprising a first plurality of electronic switches associated with the contacts of the first sensing structure and a second plurality of electronic switches associated with the contacts of the second sensing structure,
        a timing circuit providing a clock signal for opening and closing the switches of the switching blocks according to a predetermined time scheme such that a predetermined number of contacts of the plurality of contacts of the first sensing structure form a first Hall element moving in a clockwise direction along the ring-shaped well of the first sensing structure in a predefined number of steps per turn and such that a predetermined number of contacts of the plurality of contacts of the second sensing structure form a second Hall element moving in a counterclockwise direction along the ring-shaped well of the second sensing structure in the same predefined number of steps per turn, wherein the first and second Hall element are supplied with current from the at least one current source and deliver each at least one Hall voltage to the processing blocks.

2. The magnetic field sensor according to claim 1, wherein the number N of contacts is eight,
    the first switching block is adapted to close and open the first plurality of electronic switches such that at each step all eight contacts of the first sensing structure are connected either to the at least one current source or directly or indirectly to one of the processing blocks, and the second switching block is adapted to close and open the second plurality of electronic switches such that at each step all eight contacts of the second sensing structure are connected either to the at least one current source or directly or indirectly to one of the processing blocks.

3. The magnetic field sensor according to claim 2, wherein the switching blocks are configured to move the first Hall element and the second Hall element along their respective ring-shaped well in turns consisting of four or eight steps.

4. The magnetic field sensor according to claim 3, wherein each step comprises a number of two or four sub-steps wherein in the sub-steps the contacts for feeding the current and the contacts for measuring the respective Hall voltage are exchanged according to a spinning current method.

5. The magnetic field sensor according to claim 4, further comprising at least one further switching block for alternately exchanging the first and second processing block.

6. Current sensor for measuring a primary current flowing through a conductor, the current sensor comprising a magnetic field sensor according to claim 1, a coil and a current source feeding a reference current to the coil, wherein the windings of the coil are oriented with respect to a direction of the primary current such that a primary magnetic field generated by the primary current and a reference magnetic field generated by the reference current include an angle $\beta$ that is different from zero, the current sensor further comprising an electronic circuit coupled to the output of the exclusive OR gate that generates an output signal proportional to the primary current.

7. Current sensor according to claim 6, wherein the electronic circuit comprises an integrator configured to generate an output signal proportional to the tangent function, the integrator comprising an operational amplifier, a number of M switches and resistors, and a capacitor, wherein the M switches and resistors are arranged as parallel sets of one switch and one resistor arranged in series having one terminal of the switch connected to a voltage source and one terminal of the resistor connected to an input of the operational amplifier.

8. Current sensor according to claim 6, wherein the angle $\beta$ amounts to approximately 90° and wherein individual amplification factors of the amplifiers and/or individual currents flowing through the Hall elements are applied in each step.

9. Current sensor according to claim 8, wherein the number of contacts of the first sensing structure is eight, the number of contacts of the second sensing structure is eight and wherein the predefined number of steps per turn is four.

10. Current sensor according to claim 7, wherein the angle $\beta$ amounts to approximately 90° and wherein individual amplification factors of the amplifiers and/or individual currents flowing through the Hall elements are applied in each step.

11. Current sensor according to claim 10, wherein the number of contacts of the first sensing structure is eight, the number of contacts of the second sensing structure is eight and wherein the predefined number of steps per turn is four.

12. Current sensor according to claim 6, wherein the number N of contacts is eight, the first switching block is adapted to close and open the first plurality of electronic switches such that at each step all eight contacts of the first sensing structure are connected either to the at least one current source or directly or indirectly to one of the processing blocks, the second switching block is adapted to close and open the second plurality of electronic switches such that at each step all eight contacts of the second sensing structure are connected either to the at least one current source or directly or indirectly to the other one of the processing blocks, and the switching blocks are configured to move the first Hall element and the second Hall element along their respective ring-shaped well in turns consisting of 8 steps.

13. Current sensor according to claim 12, wherein the electronic circuit comprises an integrator configured to generate an output signal proportional to the tangent function, the integrator comprising an operational amplifier, a number of M switches and resistors, and a capacitor, wherein the M switches and resistors are arranged as parallel sets of one switch and one resistor arranged in series having one terminal of the switch connected to a voltage source and one terminal of the resistor connected to an input of the operational amplifier.

14. Current sensor according to claim 12, wherein the angle $\beta$ amounts to approximately 90° and wherein individual amplification factors of the amplifiers and/or individual currents flowing through the Hall elements are applied in each step.

15. Current sensor according to claim 14, wherein the number of contacts of the first sensing structure is eight, the number of contacts of the second sensing structure is eight and wherein the predefined number of steps per turn is four.

16. Current sensor according to claim 13, wherein the angle $\beta$ amounts to approximately 90° and wherein individual amplification factors of the amplifiers and/or individual currents flowing through the Hall elements are applied in each step.

17. Current sensor according to claim 16, wherein the number of contacts of the first sensing structure is eight, the number of contacts of the second sensing structure is eight and wherein the predefined number of steps per turn is four.

* * * * *

UNITED STATES PATENT AND TRADEMARK OFFICE
CERTIFICATE OF CORRECTION

PATENT NO.       : 8,624,587 B2                                       Page 1 of 1
APPLICATION NO. : 12/936906
DATED            : January 7, 2014
INVENTOR(S)      : Popovic et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 651 days.

Signed and Sealed this
Twenty-second Day of September, 2015

Michelle K. Lee
*Director of the United States Patent and Trademark Office*